United States Patent [19]
Basset

[11] 3,962,653
[45] June 8, 1976

[54] ARRANGEMENT FOR SIMULTANEOUSLY PRODUCING SIGNALS HAVING AN INCREASING FREQUENCY AND SIGNALS HAVING A DECREASING FREQUENCY

[75] Inventor: Jean-Claude Basset, Paris, France

[73] Assignee: Telecommunications Radioelectriques et Telephoniques T.R.T., Paris, France

[22] Filed: Dec. 19, 1974

[21] Appl. No.: 535,042

[30] Foreign Application Priority Data
Dec. 27, 1973  France .............................. 73.46529

[52] U.S. Cl. .................................. 331/2; 325/334; 331/1 A; 331/4; 331/178
[51] Int. Cl.² ........................................... H03B 3/04
[58] Field of Search ...................... 331/1, 2, 4, 178; 325/334

[56] References Cited
UNITED STATES PATENTS

| | | | |
|---|---|---|---|
| 3,588,730 | 6/1971 | Schreuer | 331/2 |
| 3,588,732 | 6/1971 | Tollefson | 331/2 |
| 3,764,933 | 10/1973 | Fletcher | 331/178 |
| 3,798,553 | 3/1974 | Sakamoto | 331/4 |

*Primary Examiner*—John Kominski
*Attorney, Agent, or Firm*—Frank R. Trifari; Simon L. Cohen

[57] ABSTRACT

An arrangement for simultaneously producing signals having a decreasing frequency and signals having an increasing frequency. In this arrangement the signals have frequencies which are complementary relative to the double value of a central frequency. The arrangement includes a pair of voltage-controlled oscillators controlled by signals supplied by a control generator. The arrangement is characterized in that for each oscillator there is provided with a phase control loop and that the control generator is of the digital type designed to supply two pairs of digital signals. One pair is applied to the frequency dividers and the other is applied to the oscillators so as to tune them to such a frequency that they are in the operating range of the phase control loop.

Use: Radio-electric transmission of data.

7 Claims, 7 Drawing Figures

ARRANGEMENT FOR SIMULTANEOUSLY PRODUCING SIGNALS HAVING AN INCREASING FREQUENCY AND SIGNALS HAVING A DECREASING FREQUENCY

The invention relates to an arrangement for simultaneously producing in successive and equal time intervals signals having an increasing frequency and signals having a decreasing frequency on a pair of output terminals, the increasing and decreasing frequencies being complementary relative to a certain frequency, said arrangement comprising two voltage-controlled oscillators controlled by control signals derived from a clock-synchronized control generator.

Such arrangements are known and are used in data transmission systems in which the 1 and 0 bits to be transmitted are represented by the increasing and decreasing frequency sweeps, respectively. Such a system is described in the Article by G. David, M. Duquenne and Cl. Olier, entitled: "Transmission radio électrique ay moyen d'une modulation linéaire en fréquence" published in the magazine "L'onde électrique" of March 1971.

To satisfy the requirement of complementariness of the signals having an increasing frequency and the signals having a decreasing frequency, the characteristics of the components constituting the oscillators and the control generator must be very carefully matched, which leads to difficulties in manufacture, use and maintenance.

The invention has for its object an arrangement of the type described above which is substantially independent of the characteristics of the components used and which substantially obviates transition phenomena which may occur at the ends of the above-mentioned time intervals.

The arrangement according to the invention is characterized in that each of the oscillators is incorporated in an associated phase control loop provided with a frequency divider adjustable in discrete steps, the control generator being of the digital type and adapted to produce two pairs of digital signals whose value in each of the said intervals varies between an initial vaue and a final value, one pair of said signals being applied to the frequency dividers and the other pair being applied to the oscillaors in order to tune said oscillaors to a frequency within the operating range of their phase control loop.

When using the steps according to the invention it is achieved that the structure and the satisfactory operation of the arrangement is no longer dependent on careful matching of the components used and that the requirements of complementaries is no longer affected by variations in the characteristics of these components.

Due to the steps according to the invention a relatively large frequency sweep can be realized which in the above-mentioned data transmission systems is advantageous for the transmission quality and reliability.

The invention will now be described in greater detail with reference to the accompanying drawings.

Figure 1:
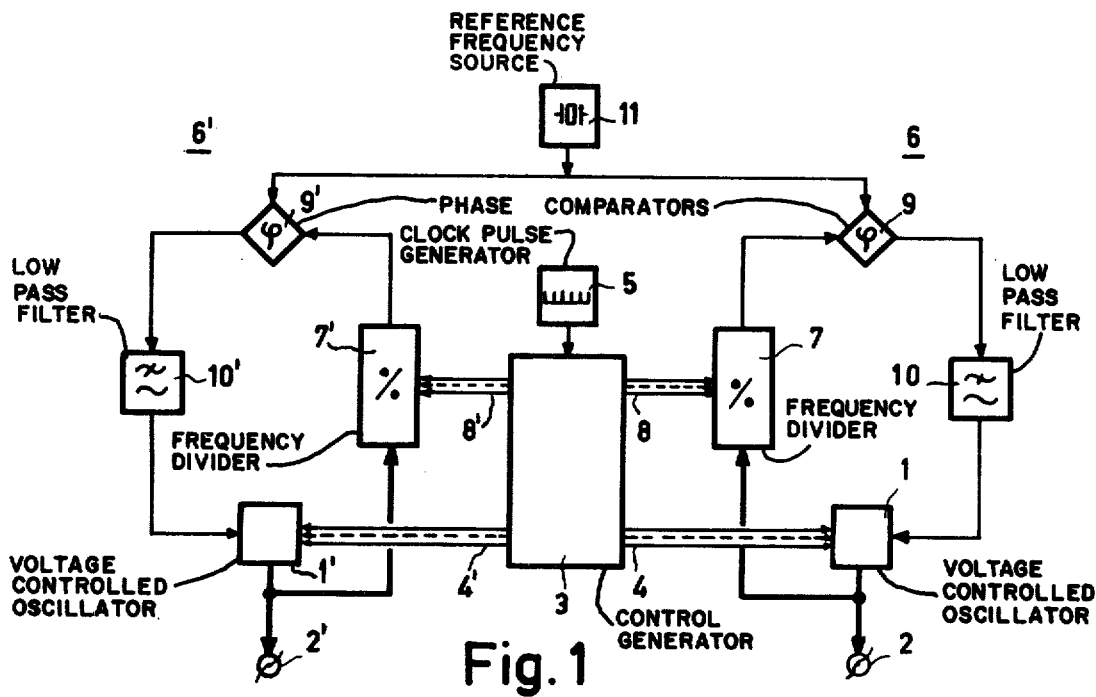
FIG. 1 shows an arrangement according to the invention.

In FIG. 1 the reference numerals 1 and 1' denote a pair of voltage-controlled oscillators whose output signals occur at the terminals 2 and 2', respectively. These oscillators are controlled in frequency by control voltages which are generated by a control generator 3 and in which control signals occur at the outputs 4 and 4' of the control generator 3.

During a succession of equal time intervals T defined by means of a clock 5 the control generator causes the output signal occurring at one of the terminals 2 or 2' to increase linearly in frequency and the occurring output signal to decrease linearly in frequency and this in such a manner that these frequency-varying output signals are complementary at any instant of each interval relative to a frequency which is equal to the double value of a certain central frequency.

According to the invention a particularly advantageous and favourable arrangement is obtained if each of the oscillators 1 and 1' is incorporated in an associated phase control loop 6 and 6', respectively which is provided with a frequency divider 7 and 7' adjustable in discrete steps, and if the control signal generator 3 is of the digital type and adapted to produce two pairs of digital signals at the outputs 4 and 4' for one pair and at the outputs 8 and 8' for the other pair, while the value of these digital signals in each of the said intervals varies between an initial value and a final value and one pair of the signals is applied to the frequency dividers 7, 7' and the other pair is applied to the oscillators 1 and 1' in order to tune these oscillators to such a frequency that they are in the operating range of their phase control loop.

In addition to the above-mentioned elements the phase control loops 6 and 6' include, as is common practice, a phase comparator 9 and 9' and lowpass filters 10 and 10'; the reference frequency source 11 is common for both loops 6 and 6'.

The oscillators 1 and 1' include a tunable circuit in which the tuning capacitor includes a variable capacity diode. The output signal of the phase comparator is applied to this diode so as to vary the value of its capacitance while the digital signals at outputs 4 and 4' serve to switch the different inductors incorporated in that manner in the tunable circuit.

Figure 2:
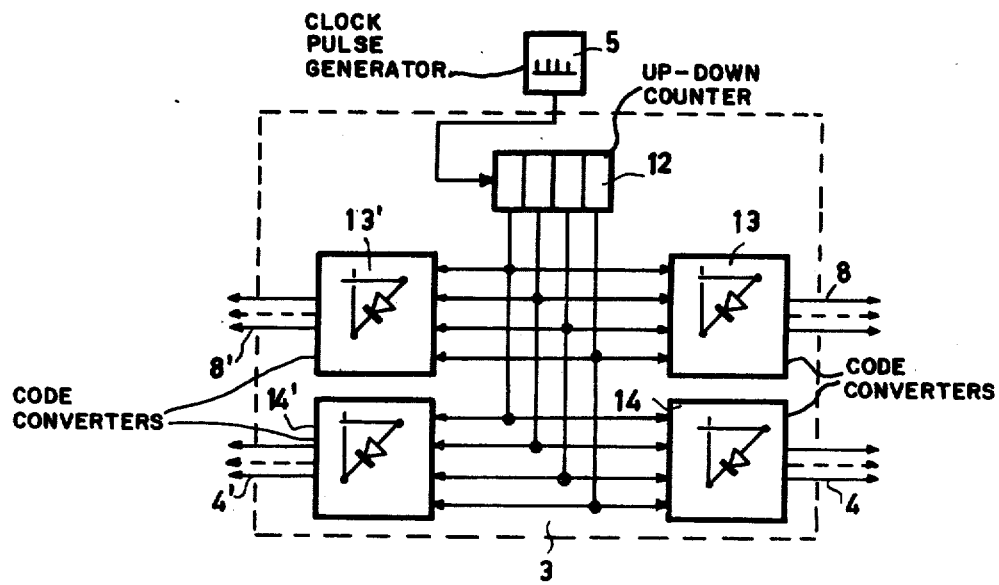
FIG. 2 shows a control signal generator in detail.

FIG. 2 shows the control signal generator 3 in detail. It includes an up-down counter 12 whose input is connected to the output of the clock 5 while the outputs of this counter 12 are connected to four code converters 13, 13', 14 and 15' whose outputs constitute the previously mentioned outputs 8, 8' and 4, 4'.

The input code of these converters is the contents of the up-down counter 12. These converters are constituted by read-only memories for which the contents of the up-down counter serve as an address. The output code may be selected by the user; these read-only memories may be of different types such as, for example, memories known under the names of ROM or PROM which can be easily programmed. The up-down counter is modulo-M-counter. Under the control of the pulses supplied by the clock 5 this counter assumes the states corresponding to the successive members: ..2,1,2,3. ..M-2, M-1, M, M-1 ... 2, 1, 2 .... i.e. when the up-down counter 12 reaches the extreme state corresponding to the number 1 it assumes the upcounting position and when the other extreme state corresponding to the number $M$ is reached, it assumes the downcounting position.

To explain the operation of the arrangement shown in FIGS. 1 and 2 it is assumed that the converter 13' is simply constituted by a network connecting the inputs and the outpus of this converter 13' together, i.e. the divider 7' divides the output frequency of the oscillator 1' by each number $M$ which may be in the up-down counter 12. The converter 13 is adapted to be such that the number dividing the frequency of the oscillator 1 is the complement of $m$ relative to $M$, i.e. the frequency of the oscillator 1 is divided by M—$m$.

The frequency of the signal supplied by the clock 5 and being equal to M/T is such that the phase control loop between two successive pulses supplied by this clock 5 has just enough time to reach the stabilized state. The phase control loop continuously seeks its stable state and as soon as it is reached the frequency dividers divide the oscillator output frequency by a number differing by one unit from the previous number. Thus the frequency of the oscillators 1 and 1' is "smoothed" by the response time of the loops 6 and 6'. In this manner the frequency transitions are reduced and thereby the level of the unwanted harmonics.

The converters 14 and 14' are formed in such manner that for each number $m$ in the up-down counter 12 the oscillator is automatically tuned to such a frequency that it is certain that the phase control loop 6 or 6' can operate effectively.

Figure 3A:
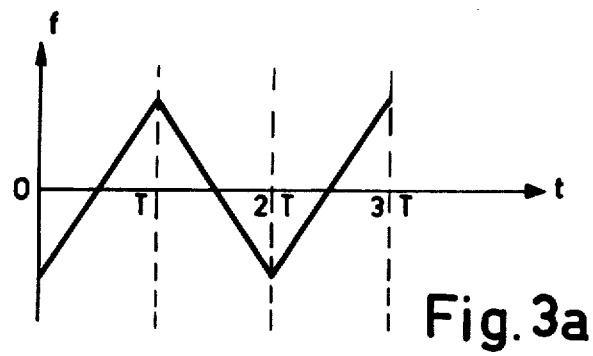
FIGS. 3a and 3b show the frequency variation of the signals at the output terminals of the arrangement shown in FIG. 1.
Figure 3B:
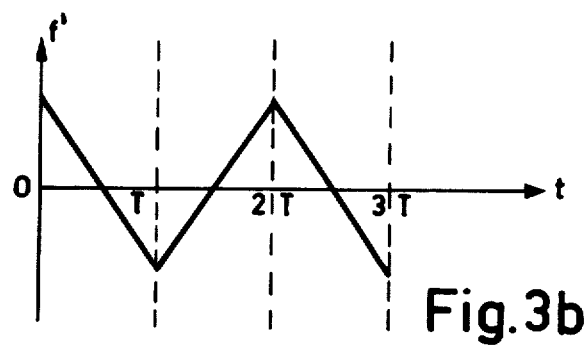

When the up-down counter 12 is in its upcounting position and the number $m$ increases from 0 to $M$, the frequency $f$ of the oscillator 1 increases from a value equal to $fr/M$ to a value $fr$ ($fr$ is the frequency of the signal supplied by the reference frequency source 11) while the frequency $f'$ of the oscillator 1' decreases from a value equal to $fr$ to a value equal to $fr/M$. The variations of the frequencies of the signals supplied by the oscillators 1 and 1' are shown as a function of time in FIGS. 3a and 3b.

These graphs show that at any moment a signal having an increasing frequency or a signal having a decreasing frequency is available and that these signals are always complementary relative to $(M+1)fr$.

Figure 4:
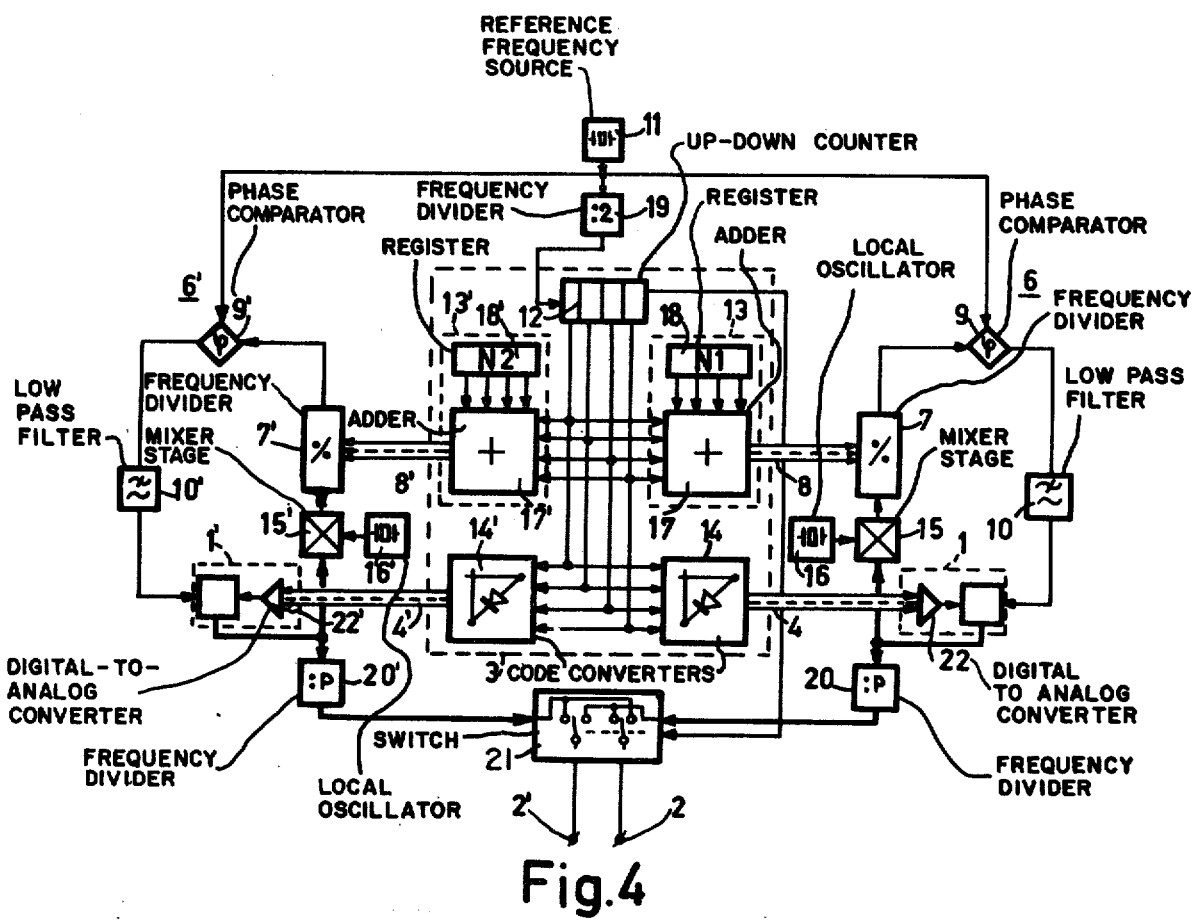
FIG. 4 shows a preferred embodiment of an arrangement according to the invention.

FIG. 4 shows a preferred embodiment of the arrangement according to the invention in which corresponding components have the same reference numerals.

In this arrangement shown in FIG. 4 each of the phase control loops 6 and 6' include a mixer stage 15, 15' whose input is connected to the output of the oscillators 1 and 1' and a second input of which is connected to the output of a local source 16 and 16', respectively. Said local sources 16 and 16' each supply an output signal, one with a frequency $fm$ and the other with a frequency $f'm$. The oscillators 1 and 1' supply signals having a frequency of $f$ and $f'$, respectively. A signal of frequency $fM = f - fm$ is obtained at the output of the mixer stage 15 and a signal whose frequency is equal to $f'M = f'm - f'$ is obtained at the output of the mixer stage 15'. The code converters 13 and 13' which form part of the control signal generator 3 are each constituted by adders 17 and 17'; the adder 17 adds to the contents of the up-down counter 12 a number $N1$ which is stored in a register 18 while the adder 17' adds to the contents of the up-down counter 12 a number $N2$ which is stored in a register 18'. The clock 5 is constituted by the reference source 11 whose output is connected to a frequency divider 19 dividing the clock frequency by two. The output of this divider is connected to the input of the counter 12.

A fixed frequency divider 20, 20' is incorporated between the output of the oscillators 1, 1' and the output terminals 2, 2'. Each output of these frequency dividers is connected to the inputs of a switch 21 while the outputs of this switch 21 are connected to the terminals 2 and 2'.

In this preferred embodiment the oscillators 1 and 1' include digital-to-analog converters 22 and 22' whose inputs are connected to the outputs 4 and 4'; the output voltage of these converters 22 and 22' act on variable capacity diodes constituting part of the tuning capacitor of the oscillator circuit while the other part of the tuning capacitor is likewise constituted by variable capacity diodes receiving the control voltages of the loops 6 and 6'.

When $fr$ is referred to as the frequency of the signal applied by the reference source 11 and $m$ is the number present in the up-down counter 12, the frequencies $f$ and $f'$ of the oscillators 1 and 1' are equal to $$f = f_m - (m + N1)fr \qquad (1)$$

$$f' = f_m + (m + N2)fr \qquad (2)$$

The frequencies F and F' of the signals at the output of the fixed dividers 20 and 20' which divide by P are equal to $$F = \frac{fm - (m + N1)fr}{P} \qquad (3)$$

$$F' = \frac{f'm + (m + N2)fr}{P} \qquad (4)$$

These two frequencies $F$ and $F'$ are complementary relative to a frequency $Fc$ $$Fc = \frac{fm + f'm + (N2 - N1)fr}{P} \qquad (5)$$

The above-mentioned equation 5 shows that the criterion of the complementariness is satisfied since $Fc$ is only dependent on the frequencies $fm, f'm$ and $fr$ which are completely stable and on the numbers $N2, N1$ and $P$ which are completely defined.

In the preferred embodiment shown in FIG. 4 the frequency of the signal occurring at the output of the frequency divider 19 is equal to $fr/2$, i.e. the number $M$ which is the maximum number that can be in the up-down counter 12 and in connection therewith the number of steps which is necessary to obtain the frequency sweep $\Delta f$ which is equal to:

$$M = (fr.T)/2 \qquad (6)$$

and to:

$$M = P \, \Delta F/fr \qquad (7)$$

Starting from these equations 6 and 7 we obtain:

$$fr^2 = (2/T) \cdot \Delta F \cdot P \qquad (8)$$

$$M^2 = (P \cdot \Delta F \cdot T)/2 \qquad (9)$$

The latter equation shows that for a given frequency sweep $\Delta f$ the number of steps can be increased due to the dividers 20 and 20'. This increase of the number of steps reduces the successive transitions and thereby the level of the harmonics of the output signals supplied by the arrangement.

On the other hand it is achieved by the frequency transportation of the oscillator frequency in the mixer stages 15 and 15' that the frequency dividers 7 and 7' may be relatively simple.

Figure 5A:
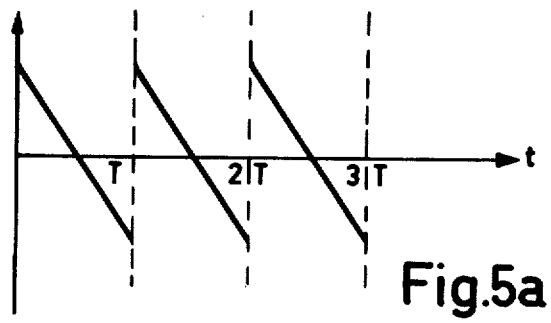
FIGS. 5a and 5b show the variations of the frequency of the signals at the outputs of the arrangement shown in FIG. 4.
Figure 5B:
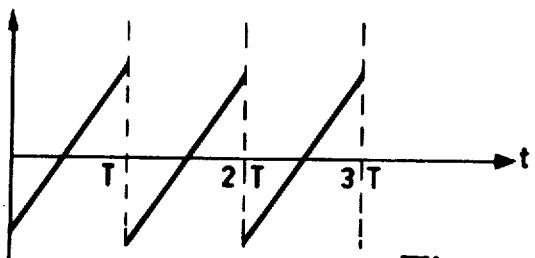

To systematically have available per time interval T a signal having an increasing frequency at one of the output terminals and a signal having a decreasing frequency at the other terminal the switch 21 is used which is controlled by a signal derived from the mp-down counter while this signal is representative of the instantaneous position (upcounting or downcounting) of the counter 12. The signals occurring at the terminals 2 and 2' have frequencies which vary as a function of time in the same direction as can be seen in FIGS. 5a and 5b.

The contents of the registers 18 and 18' can be written in with numbers other than N1 and N2, if desired, so as to vary in a simple manner the frequency sweep and/or the complementary frequency Fc.

The invention is not limited to the embodiment described hereinbefore. For example, the frequency of the signals supplied by the local sources 16 and 16' and the signals occurring at the output of the mixer stages 15 and 15' may be equal while on the other hand one of the adders 17 or 17' may be replaced by a subtractor.

Although an arrangement has been described hereinbefore which supplies signals having a linear frequency variation, it is alternatively possible to generate signals in the arrangement according to the invention whose frequency varies in accordance with a given law. For this purpose the different converters may be formed in a suitable manner.

What is claimed is:

1. An arrangement for simultaneously producing in successive and equal time intervals signals having an increasing frequency and signals having a decreasing frequency on a pair of output terminals, the increasing and decreasing frequencies being complementary relative to a certain frequency, said arrangement comprising two voltage-controlled oscillators controlled by control signals derived from a clock-synchronized control generator, characterized in that each of the oscillators is incorporated in an associated phase control loop provided with a frequency divider adjustable in discrete steps, the control generator being of the digital type and adapted to produce two pairs of digital signals whose value in each of the said intervals varies between an initial value and a final value, one pair of said signals being applied to the frequency dividers and the other pair being applied to the oscillators in order to tune said oscillaors to a frequency within the operating range of their phase control loop.

2. An arrangement as claimed in claim 1, characterized in that the control generator includes an up-down counter for counting pulses supplied by the clock and four code converters connected to said counter for supplying said pairs of control signals.

3. An arrangement as claimed in claim 2, characterized in that the code converters supplying the control signals for adjusting the adjustable frequency dividers are constituted by an adder in which the number of the up-down counter is added to a fixed number.

4. An arrangement as claimed in claim 3, characterized in that each of the phase control loops incorporates a mixer stage an input of which is connected to the output of the relevant oscillator and the second input of which is connected to a local reference signal source whose output is connected to the adjustable divider.

5. An arrangement as claimed in claim 4, characterized in that the local reference signal sources supply signals having mutually different frequencies and that the complementariness of the signals with increasng frequencies and decreasing frequencies is satisfied by the fact that in the mixer stage of one of the phase control loops the output frequency of the oscillator of this loop is transposed downwards by the frequency of the output signal of the local reference signal source and that in the mixer stage of the other loop the frequency of the output signal of the other local reference signal source is transposed downwards by the frequency of the output signal of the other oscillator.

6. An arrangement as claimed in claim 1, characterized in that the complementariness of the increasing and decreasing frequencies is satisfied by the fact that one of the converters of the pair of converters supplying the control signals for adjusting the adjustable dividers is constituted by a subtractor in which the nuber present in the up-down counter is subtracted from a first fixed number while the other converter is constituted by an adder in which the number which is present in the up-down counter is added to a second fixed number.

7. An arrangement as claimed in claim 1, characterized in that each of the oscillators is connected through a fixed frequency divider to an output terminal of the arrangement.

* * * * *

UNITED STATES PATENT AND TRADEMARK OFFICE
CERTIFICATE OF CORRECTION

PATENT NO. : 3,962,653
DATED : June 8, 1976
INVENTOR(S) : JEAN-CLAUDE BASSET

It is certified that error appears in the above-identified patent and that said Letters Patent are hereby corrected as shown below:

Col. 1, line 44, "vaue" should be --value--;

line 54, "complementaries" should be --complementariness--;

Col. 2, line 64, after "is" should be --a--;

line 66, "members" should be --numbers--;

Col. 5, line 8, "transportation" should be --transposition--;

Claim 6, line 6, "nuber" should be --number--;

Signed and Sealed this

Twenty-first Day of September 1976

[SEAL]

Attest:

RUTH C. MASON
*Attesting Officer*

C. MARSHALL DANN
*Commissioner of Patents and Trademarks*